(12) United States Patent
Raz et al.

(10) Patent No.: US 7,994,959 B2
(45) Date of Patent: Aug. 9, 2011

(54) SYSTEM AND METHOD OF SIGNAL SENSING, SAMPLING AND PROCESSING THROUGH THE EXPLOITATION OF CHANNEL MISMATCH EFFECTS

(75) Inventors: Gil M. Raz, Concord, MA (US); Jeffrey H. Jackson, Arlington, MA (US); Jarvis D. Haupt, Houston, TX (US)

(73) Assignee: GMR Research & Technology, Inc., Concord, MA (US)

( * ) Notice: Subject to any disclaimer, the term of this patent is extended or adjusted under 35 U.S.C. 154(b) by 0 days.

(21) Appl. No.: 12/587,560

(22) Filed: Oct. 7, 2009

(65) Prior Publication Data

US 2010/0103008 A1    Apr. 29, 2010

Related U.S. Application Data

(60) Provisional application No. 61/195,467, filed on Oct. 7, 2008.

(51) Int. Cl.
*H03M 1/12* (2006.01)
(52) U.S. Cl. ........ 341/155; 341/118; 341/119; 341/120; 341/159
(58) Field of Classification Search .................. 341/118, 341/155, 159
See application file for complete search history.

(56) References Cited

U.S. PATENT DOCUMENTS

| 6,177,893 | B1 * | 1/2001 | Velazquez et al. | 341/118 |
|---|---|---|---|---|
| 6,943,548 | B1 * | 9/2005 | Hertz | 324/309 |
| 7,084,793 | B2 * | 8/2006 | Elbornsson | 341/118 |
| 7,292,168 | B2 * | 11/2007 | Wesselink et al. | 341/123 |
| 7,324,036 | B2 * | 1/2008 | Petre et al. | 341/155 |
| 7,649,484 | B1 * | 1/2010 | Wegener | 341/155 |
| 7,796,068 | B2 * | 9/2010 | Raz et al. | 341/120 |
| 7,808,407 | B2 * | 10/2010 | Zimmerman et al. | 341/118 |
| 2004/0017306 | A1 * | 1/2004 | Miao | 341/155 |
| 2009/0021406 | A1 * | 1/2009 | Zimmerman et al. | 341/118 |
| 2009/0033529 | A1 * | 2/2009 | Raz et al. | 341/120 |
| 2009/0315750 | A1 * | 12/2009 | Nguyen et al. | 341/155 |
| 2010/0085231 | A1 * | 4/2010 | Doris | 341/155 |
| 2010/0281090 | A1 * | 11/2010 | Chan et al. | 708/320 |

* cited by examiner

*Primary Examiner* — Linh V Nguyen
(74) *Attorney, Agent, or Firm* — Kriegsman & Kriegsman

(57) ABSTRACT

A system for sensing, sampling and processing an input signal includes an encoding subsystem for sensing and sampling the input signal into a plurality of distinct data paths using a sub-Nyquist sampling rate. The system architecture is designed to induce encoded variations between the plurality of data paths, such as channel differences in amplitude or phase. The system additionally includes a decoding subsystem for reconstructing the encoded signal back to its original bandwidth. Preferably, the decoding subsystem exploits mismatch effects between the plurality of data paths as a form of signal diversity to resolve ambiguities introduced from sub-Nyquist signal sampling during signal reconstruction.

14 Claims, 14 Drawing Sheets

SYSTEM AND METHOD OF SIGNAL SENSING, SAMPLING AND PROCESSING THROUGH THE EXPLOITATION OF CHANNEL MISMATCH EFFECTS

CROSS-REFERENCE TO RELATED APPLICATIONS

The present application claims the benefit under 35 U.S.C. 119(e) of U.S. provisional Patent Application Ser. No. 61/195,467, filed Oct. 7, 2008, the disclosure of which is incorporated herein by reference.

BACKGROUND OF THE INVENTION

The present invention relates generally to the field of signal sensing, sampling and processing and more particularly to systems and methods designed to sense, sample and process relatively sparse signals having spectral content over a very large frequency range.

In the field of analog and digital communications, a signal is commonly defined as anytime-varying or spatial-varying quantity that conveys information (e.g., an energy signal or power advance).

Sampling and reconstruction processes are commonly utilized in signal sensing, sampling and processing systems to, inter alia, digitize an analog input signal. As defined herein, the term "sampling" relates to the process of converting a continuous input signal into a plurality of discrete signals by observing the value of the input signal at a series of sample points. The term "reconstruction" relates to the formation of the collection of discrete signals back into a continuous signal form.

The rate at which a system samples an input signal is commonly referred to as its "sampling rate" in the art. In most systems, input signals are sampled in accordance with the Nyquist sampling rate in order to ensure accurate reconstruction. Simply stated, the Nyquist sampling theorem states that, if the bandwidth of a received signal is f Hz, then at least two samples per cycle are required to ensure proper reconstruction (i.e., the sampling rate must be at least 2f). If a sub-Nyquist sampling rate is utilized, aliasing may occur during reconstruction. As defined herein, "aliasing" relates to, inter alia, (i) the loss of some frequency information with respect to the original signal when sampled at a slow rate and (ii) the generation of frequency-shifted replicas of a target signal when the digitized signal is reconstructed as a continuous time signal. As will be shown in detail below, signal replicas caused from aliasing often create ambiguities and/or overlap with the target signal, which is highly undesirable.

In view of the aforementioned shortcomings associated with sub-Nyquist sampling, systems traditionally utilize a sampling rate that is in accordance with the Nyquist sampling theorem. However, it has been found that sampling in accordance with the Nyquist sampling theorem introduces a number of notable drawbacks.

As a first drawback, systems using a sampling rate at or above the Nyquist standard are often limited in dynamic range. For instance, if the sampling rate of the sampling device is set too high, the noise produced by the device often rises to a level that significantly compromises the overall performance of the system, which is highly undesirable.

As another drawback, systems using a sampling rate at or above the Nyquist standard often require signal processing algorithms that have a substantial, or even unattainable, level of computational complexity, which is highly undesirable.

As another drawback, systems using a sampling rate at or above the Nyquist standard often impose considerable, often impractical, system requirements with respect to data storage, size, weight, power consumption and cost, which is highly undesirable.

As another drawback, systems using a sampling rate at or above the Nyquist standard often exceed the performance capabilities of known sampling devices in the art. For example, in certain wide bandwidth applications, a relatively high sample rate is required that is presently unattainable by most, if not all, conventional sampling devices, which is highly undesirable.

As another drawback, systems using a sampling rate at or above the Nyquist standard often necessitate the practice of "selective channeling". As defined herein, selective channeling relates to processing only those signals that are located within a particular channel, or segment, of an entire bandwidth of interest. As can be appreciated, selective channeling can result in removing potentially pertinent signals located within the bandwidth of interest from detection and processing, which is highly undesirable in certain applications (e.g., military applications).

In view of the aforementioned restrictions associated with the Nyquist sampling condition, it is well known in the art for systems to utilize an undersampling approach for sampling signals that are known to contain spectral content over a large frequency range. As defined herein, "undersampling" denotes sampling below the Nyquist rate. Specifically, instead of collecting samples at the Nyquist rate of $f_{Nyquist}=2f_{max}$ samples per index variable unit, samples are collected at the rate of $f_{sample}=f_{Nyquist}/N$ samples per index variable unit for some $N>1$. Accordingly, this approach is commonly referred to in the art as undersampling by a factor of N. Furthermore, when the samples are collected at points uniformly spaced in the index variable, this approach is commonly referred to in the art as uniform undersampling by a factor of N.

As noted above, sub-Nyquist sampling induces aliasing. Accordingly, it is to be understood that systems that rely upon undersampling typically include logic to reduce the deleterious effects associated with aliasing.

For example, compressed sampling is one well-known undersampling approach that resolves aliasing using appropriate logic. Specifically, compressed sensing, also known as compressive sampling, is a technique for acquiring and reconstructing a signal by first randomizing, or scrambling, sensed signals located within a relatively large frequency range that are known to be sparse in nature and then, in turn, reconstructing the randomized signal within its proper location within the frequency spectrum using the known signal randomization information.

Although well-known in the art, the compressed sampling approach is limited for use with very sparse signals that have spectral content over a very large frequency range. As defined herein, "sparse signals" denotes signals with relatively low information density (e.g., relatively few of the spectral components of the signal have significant amplitudes and the amplitudes of remaining spectral content are zero or negligibly small). Signals that fail to comply with the degree of sparseness required by the compressed sampling approach are typically incapable of accurate reconstruction, which is highly undesirable.

It should be noted that additional approaches for resolving ambiguities created from undersampling are known in the art. As an example, in U.S. Pat. No. 7,173,555 to G. M. Raz, there is disclosed a method and system of signal processing that utilizes identified distortion products, such as nonlinear artifacts, to resolve ambiguities associated with sub-Nyquist sampling, the disclosure of which is incorporated herein by reference.

SUMMARY OF THE INVENTION

It is an object of the present invention to provide a novel method and system for signal sensing, sampling and processing.

It is another object of the present invention to provide a method and system for sensing, sampling and processing sparse and/or nearly sparse signals with spectral content over a very large frequency range.

It is yet another object of the present invention to provide a method and system as described above which utilize mathematical modeling tools which are neither cumbersome nor computationally complex in nature.

It is still another object of the present invention to provide a method and system as described above which have limited storage, size, weight and cost requirements.

Accordingly, it is to be understood that the present invention relies generally upon the exploitation of distortion discrepancies, mismatches and/or nonlinear artifacts produced from signal sensing, sampling and processing systems as a form of signal diversity.

Specifically, according to one feature of the present invention, there is provided a system for sensing, sampling and processing an input signal of a first bandwidth, the system comprising (a) an encoding subsystem for sensing and sampling the input signal into a plurality of distinct data paths so as to yield a multi-channel encoded signal of a second bandwidth, the encoded signal including at least one channel mismatch effect, and (b) a decoding subsystem for processing the encoded signal back to the first bandwidth to yield a decoded output signal, the decoding subsystem exploiting the information provided by the at least one channel mismatch effect to accurately reconstruct the encoded signal in the first bandwidth.

According to another feature of the present invention, there is provided a method of sensing, sampling and processing an input signal using a signal sensing, sampling and processing system, the signal sensing, sampling and processing system comprising an encoding subsystem and a decoding subsystem, the method comprising the steps of (a) setting the operating parameters for the encoding subsystem, (b) encoding the input signal into a plurality of distinct data paths using the encoding subsystem so as to yield a multi-channel encoded signal of a second bandwidth that includes at least one channel mismatch effect, and (c) decoding the encoded signal using the decoding subsystem to yield a decoded output signal of the first bandwidth, the decoding step exploiting the information provided by the at least one channel mismatch effect to accurately reconstruct the encoded signal back in the first bandwidth.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE PREFERRED EMBODIMENT

Overview of Present Invention

As will be described in detail below, the general principal behind the present invention relates to the exploitation of channel mismatch effects generated by signal sensing, sampling and processing systems in order to create and exploit a novel form of signal diversity.

A system which includes a multi-channel encoder typically converts an input signal into a digital output signal which includes, among other things, one or more channel mismatch effects between the multiple channels. As defined herein, channel mismatch effects, or simply mismatch effects, are created between multiple paths, or channels, of data streams as a result of differences between channels with respect to, inter alia, phase, amplitude, jitter and/or nonlinearities.

Traditionally, channel mismatch effects are regarded as the undesirable component of the output signal and, as a result, are typically minimized to the greatest extent possible. Contrary to traditional practice, the present invention exploits the presence of channel mismatch effects in order to learn useful information about a signal sensing, sampling and processing system and, in turn, use this information to accurately reconstruct a signal output therefrom.

Signal Sensing, Sampling and Processing System 11

Figure 1:
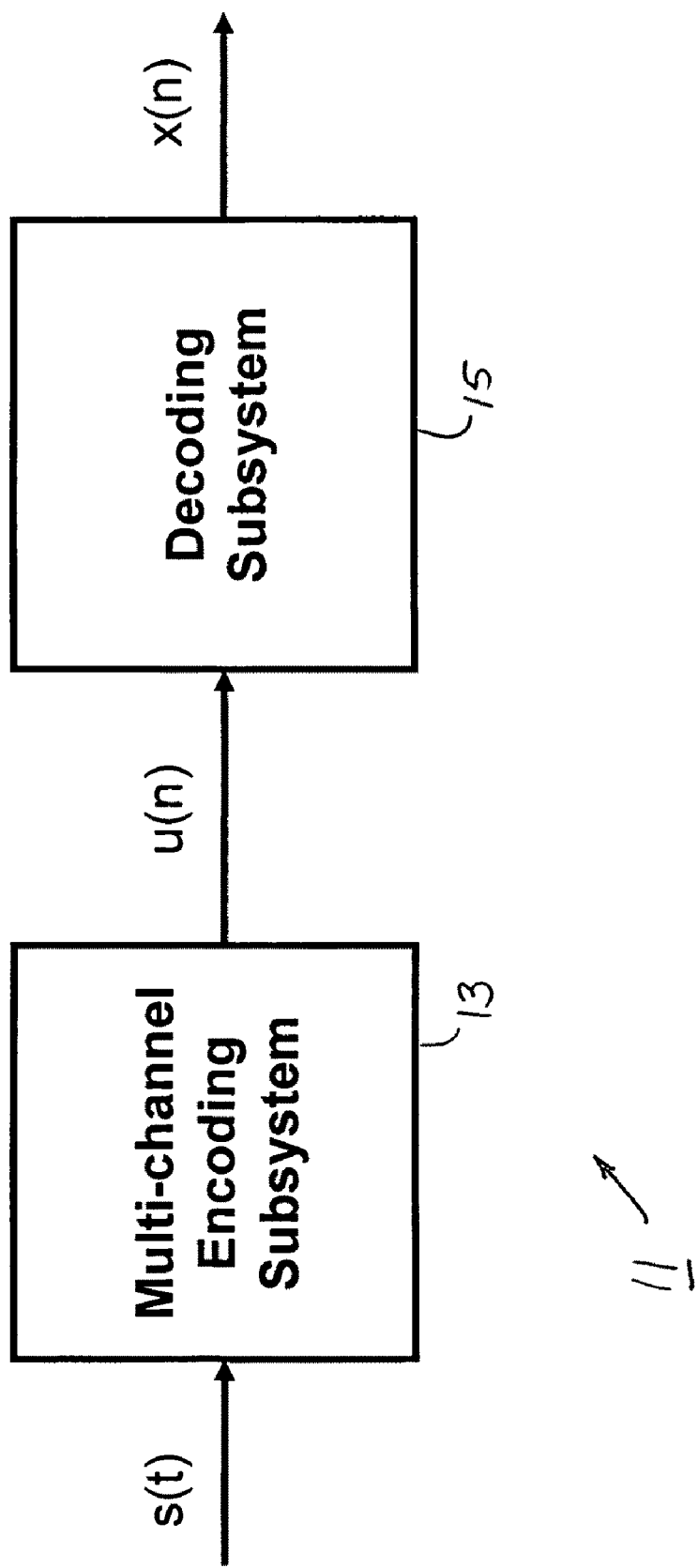
FIG. 1 is a simplified schematic representation of a novel signal sensing, sampling and processing system constructed according to the teachings of the present invention.

Referring now to FIG. 1, there is shown a signal sensing, sampling and processing system that is constructed according to the teachings of the present invention, the system being identified generally by reference numeral 11. As can be seen, system 11 comprises a multi-channel encoding subsystem 13 which encodes (e.g., senses and samples) an input signal s(t) into multiple sampled channels to yield an N-channel encoded digital signal u(n) and a decoding subsystem 15 for decoding (e.g., reconstructing and processing) encoded signal u(n) by exploiting channel mismatch effects present therein to yield a decoded digital output signal x(n).

Although not shown herein, it is to be understood that any distortion products (e.g., interleaving distortion products) that remain in output signal x(n) after reconstruction may then be minimized by decoding subsystem 15 itself and/or a digital signal processor located at its back end. Examples of processors that can be used to equalize distortion products include, but are not limited to, digital signal processors of the type disclosed in either U.S. Pat. No. 6,639,537 to G. M. Raz or pending U.S. patent application Ser. No. 11/280,970 entitled, "Method and System of Nonlinear Signal Processing" which was filed in the names of G. M. Raz and Cy P. Chan, both of the aforementioned disclosures being incorporated herein by reference.

As noted above, encoding subsystem 13 generates two or more encoded channels from the same input signal s(t). In this manner, each channel is available for independent processing prior to digitization, which is highly desirable.

In one practical application of the present invention, encoding subsystem 13 is configured to sample input signal s(t) using a sub-Nyquist sampling rate in order to, among other things, enhance system performance. To resolve issues typically associated with undersampling (e.g., aliasing), decoding subsystem 15 preferably exploits the information associated with the channel mismatch effects generated by encoding subsystem 13, as will be described further in detail below.

It should be noted that signal processing system 11 is designed to receive an input signal s(t) that preferably includes sparse, or nearly sparse, content over a large frequency range. However, it is to be understood that system 11 is capable of processing alternative types of input signals without departing from the spirit of the present invention.

Figure 2:
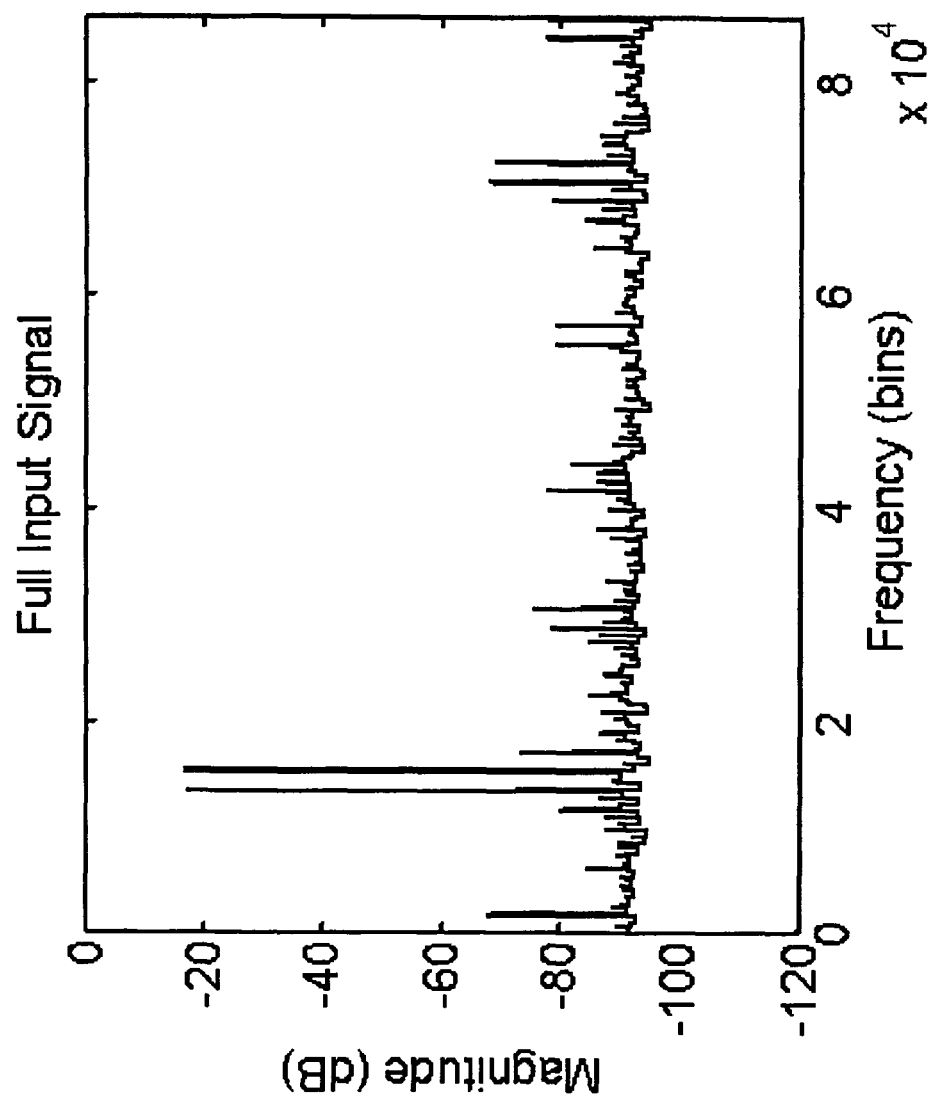
FIG. 2 is a graphical representation of a sample encoded output signal which is the result of the transmission of a two tone input signal through the encoding subsystem shown in FIG. 1.

As referenced briefly above, decoding subsystem 15 exploits channel mismatch effects present in encoded signal u(n) to yield a decoded output signal x(n) that accurately reconstructs encoded signal u(n) within in its proper frequency zone. Specifically, referring now to FIG. 2, there is shown a graphical representation of a sample encoded signal that has been generated from the transmission of a two tone input signal through one implementation of encoding subsystem 13. As can be seen, encoding subsystem 13 is responsible for generating an output signal that includes both (i) a desired product 21 (i.e., the target, two tone input signal) and (ii) channel mismatch effects 23. The information provided by channel mismatch effects 23, as well as certain distortion products present therein, such as interleaving distortion products, is exploited by decoding subsystem 15 in order to accurately represent target signal 21 within its proper frequency zone during the signal reconstruction process, as will be described further in detail below.

Encoding Subsystem Implementations

It is to be understood that encoding subsystem 13 is not limited to one particular architecture. Rather, it should be noted that encoding subsystem 13 could be implemented as various types of structures without departing from the spirit of the present invention. Accordingly, referring now to FIGS. 3(a)-(f), there is shown a series of signal processing systems that include unique encoding subsystem implementations.

Figure 3A:
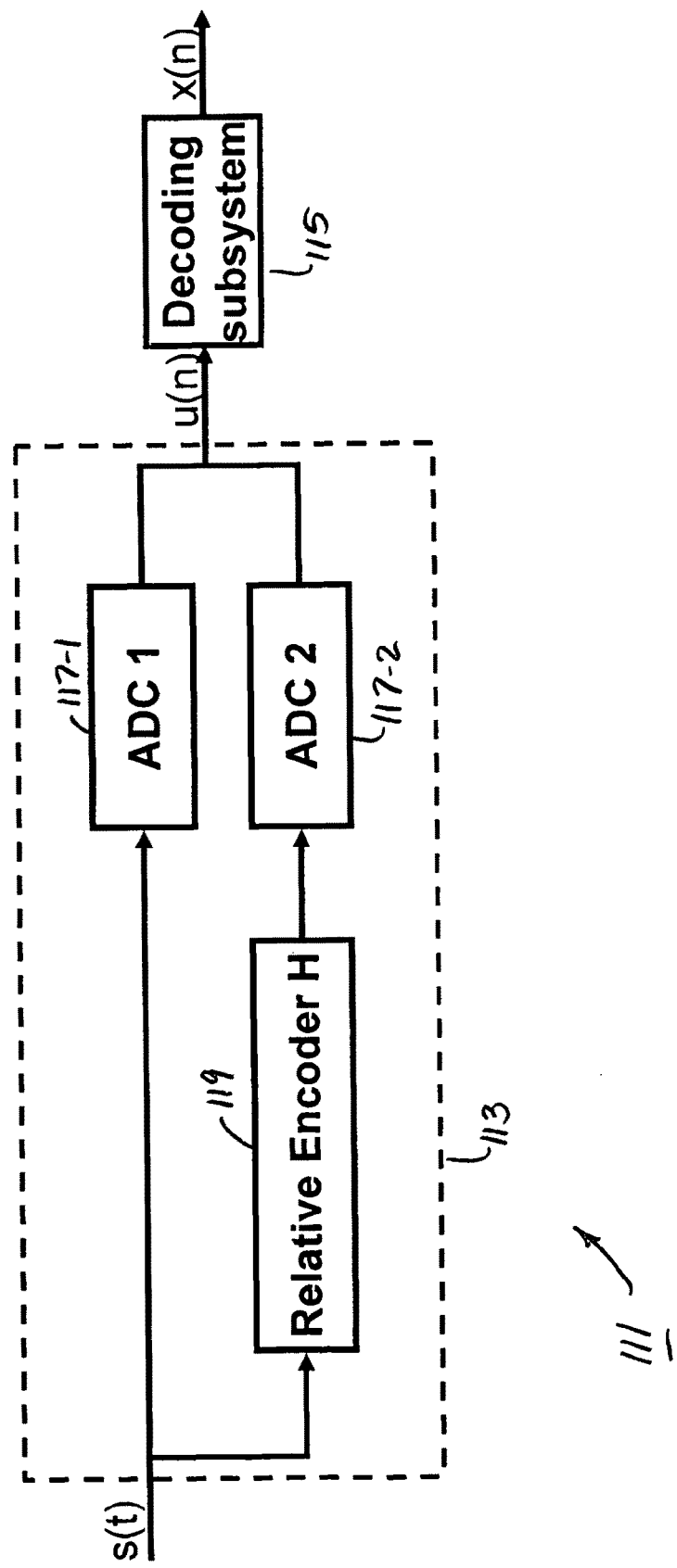
FIGS. 3(a)-(f) are detailed schematic implementations of variations of the encoding subsystem shown in the signal processing system of FIG. 1.

In FIG. 3(a), there is shown a simplified schematic representation of a more detailed analog signal sensing, sampling and processing system, the system being identified generally by reference numeral 111. As can be seen, system 111 comprises a novel multi-channel encoding subsystem 113 for sensing and sampling an input signal s(t) into multiple channels to yield a N-channel encoded signal u(n) and a decoding subsystem 115 for reconstructing and processing encoded signal u(n) by exploiting channel mismatch distortion products present therein to yield an decoded output signal x(n).

As represented herein, encoding subsystem 113 comprises first and second analog-to-digital converters (ADCs) 117-1 and 117-2 and a linear filter 119. As defined herein, use of the term "analog-to-digital converter" denotes any known device for sensing and sampling an analog signal. In use, encoding subsystem 113 processes input signal s(t) into two distinct paths: (i) a first signal path that passes directly into ADC 117-1 and (ii) a second signal path that first passes through linear filter 119 before being processed by ADC 117-2.

As can be appreciated, ADCs 117-1 and 117-2 are intended to operate with the same reference levels and sample clock. Accordingly, the effect of linear filter 119 is to impart a frequency-dependent phase shift (and optional amplitude change) to the second signal path. This change in complex amplitude of the second signal path is then captured by second ADC 117-2. As a result, the full frequency of input signal s(t) can be decoded by decoding subsystem 115, inter alia, by comparing the measured change in complex amplitude of known distortion products against the characterized behavior of encoding subsystem 113.

It should be noted that the present invention is not limited to a parallel pair of analog processing streams as represented in encoding subsystem 113. Rather, it is to be understood that encoding subsystem 113 could be constructed with additional processing paths in order to capture more diverse information from input signal s(t).

Figure 3B:
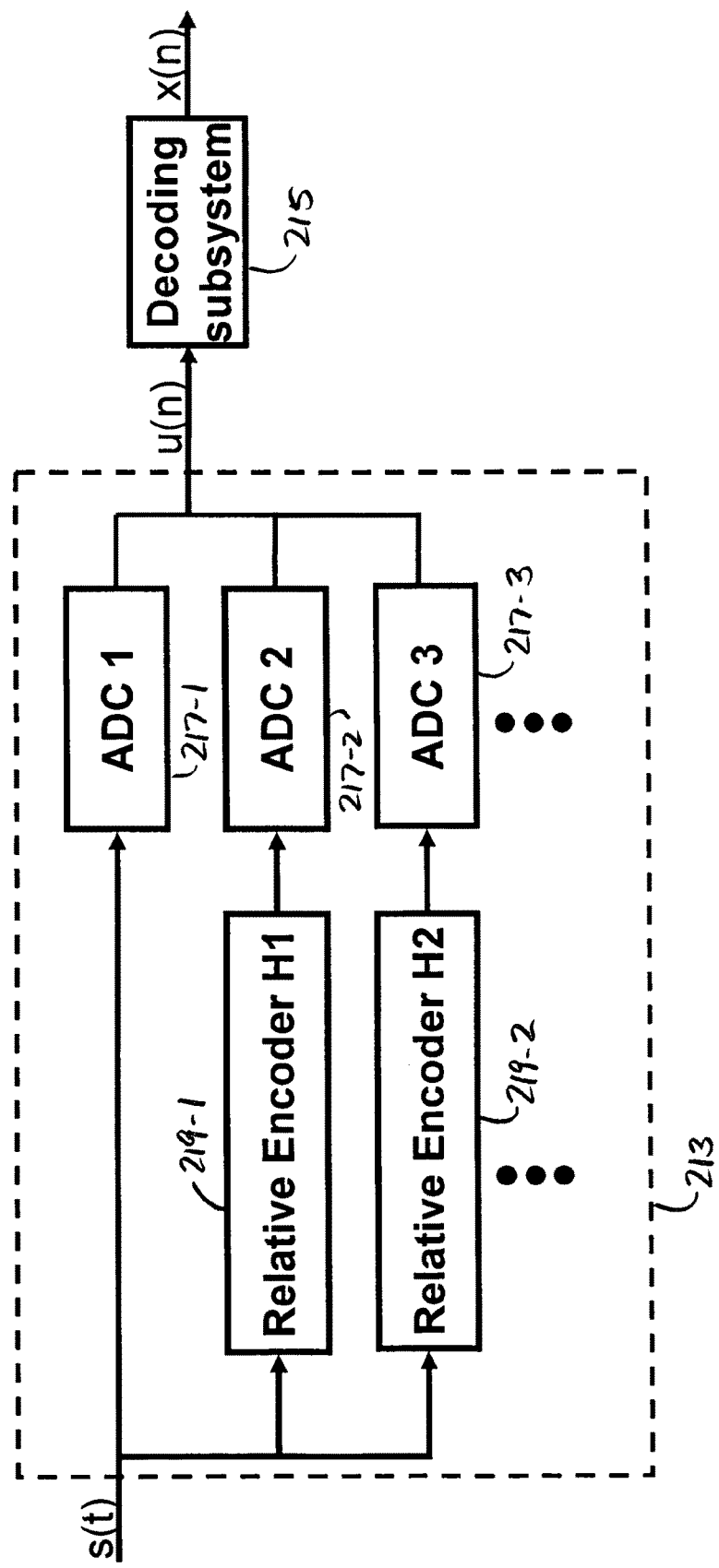

For instance, in FIG. 3(b), there is shown a simplified schematic representation of another modified signal sensing, sampling and processing system, the system being identified generally by reference numeral 211. As can be seen, system 211 comprises a modified multi-channel encoding subsystem 213 for encoding an input signal s(t) into multiple channels to yield an N-channel encoded signal u(n) and a decoding subsystem 215 for decoding signal u(n) by exploiting channel mismatch effect present therein to yield an decoded output signal x(n).

System 211 differs from system 111 in the architecture of their respective encoding subsystems. Specifically, encoding subsystem 213 includes additional parallel processing streams that, in turn, can be used capture additional information from input signal s(t). In particular, subsystem 213 is represented herein as comprising a first signal path that passes directly into a first ADC 217-1, a second signal path that passes through a linear filter 219-1 before being processed by a second ADC 217-2, and a third signal path that passes through a linear filter 219-2 before being processed by a third ADC 217-3, with extra processing paths attainable through the further combination of additional ADCs 217 and corresponding filters 219.

As can be appreciated, the use of different linear filters 219 for each processing path provides channel mismatch effects that can be exploited by decoding subsystem 215 during signal reconstruction, which is highly desirable. Furthermore, it is to be understood that using different sampling rates for each of the ADCs 217 may additionally serve to provide exploitable channel mismatch effects that can be used by decoding subsystem 215 to resolve ambiguities that exist for signals located near frequency zone boundaries.

It should be noted that additional devices may be incorporated into the architecture of the encoding subsystems described in detail above in order to generate distortion-based information that can be exploited by the decoding subsystem during reconstruction.

Figure 3C:
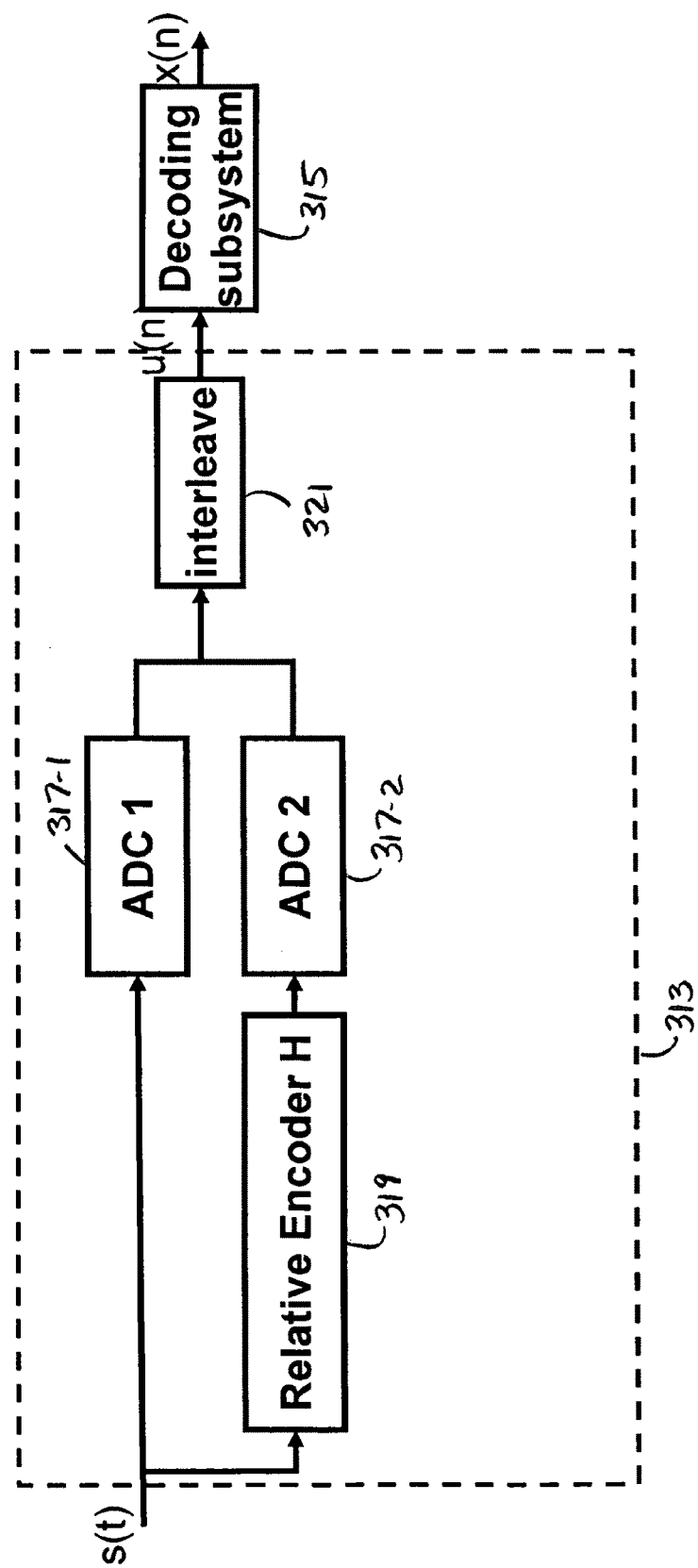

As an example, in FIG. 3(c), there is shown a simplified schematic representation of another signal sensing, sampling and processing system, the system being identified generally by reference numeral 311. As can be seen, system 311 comprises a modified multi-channel encoding subsystem 313 for encoding an input signal s(t) into multiple paths to yield an N-channel encoded signal u(n) and a decoding subsystem 315 for decoding signal u(n) by exploiting mismatch effects present therein to yield an decoded output signal x(n).

System 311 differs from system 111 in the architecture of their respective encoding subsystems. Specifically, encoding subsystem 313 is similar to encoding subsystem 113 in that encoding subsystem 313 comprises first and second analog-to-digital converters 317-1 and 317-2 and a linear filter 319, with encoding subsystem 313 processing input signal s(t) into two distinct paths: (i) a first signal path that passes directly into ADC 317-1 and (ii) a second signal path that first passes through linear filter 319 before processing by ADC 317-2.

Encoding subsystem 313 differs from encoding subsystem 111 in that encoding subsystem 313 additionally includes an interleave 321 for interleaving the multiple data stream outputs from ADCs 317 prior to decoding. In this capacity, it is to be understood that interleave-based distortion products generated by interleave 321 can be used as an additional form of signal diversity during signal reconstruction by decoding subsystem 315.

Figure 3D:
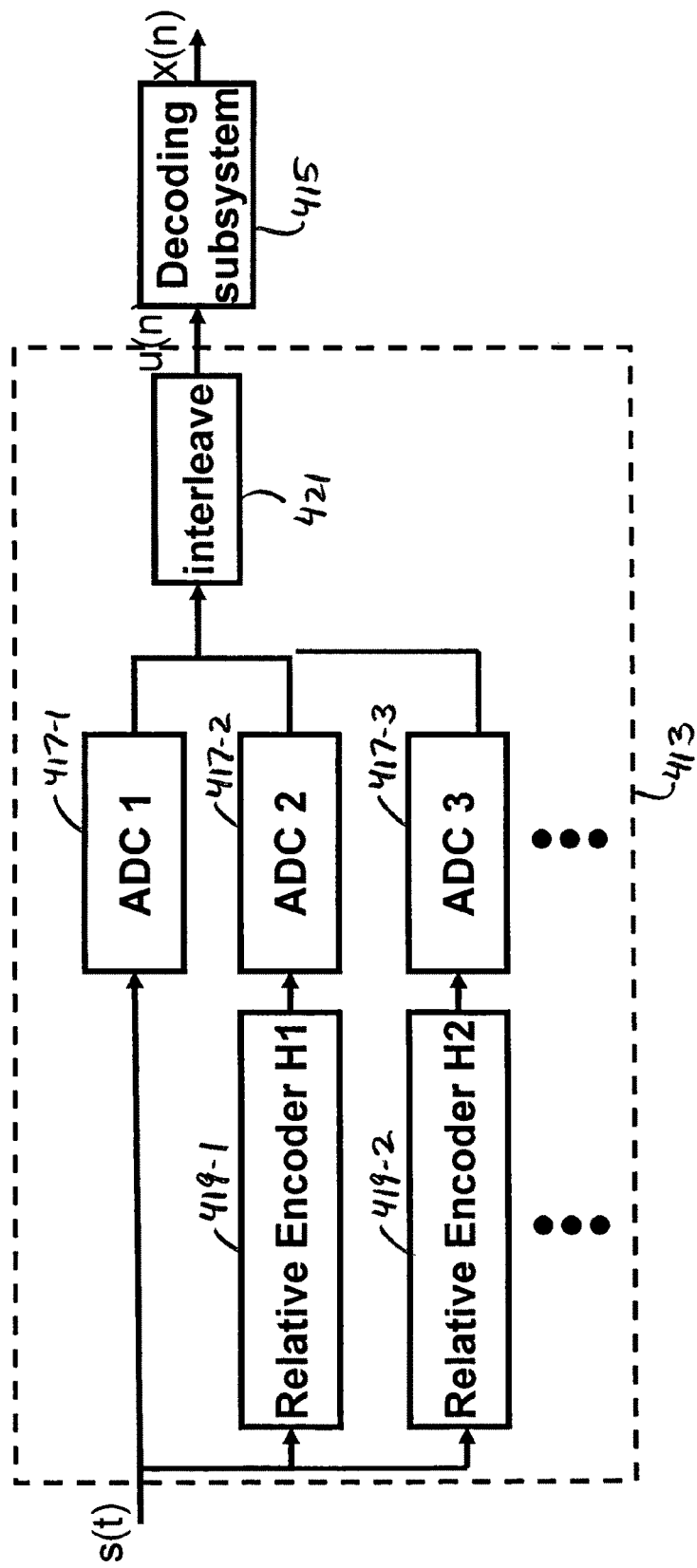

Similarly, in FIG. 3(d), there is shown a simplified schematic representation of another signal sensing, sampling and processing system, the system being identified generally by reference numeral 411. As can be seen, system 411 comprises a modified multi-channel encoding subsystem 413 for encoding an input signal s(t) into multiple paths to yield an N-channel encoded signal u(n) and a decoding subsystem 415 for decoding signal u(n) by exploiting mismatch effects present therein to yield an decoded output signal x(n).

System 411 differs from system 211 in the architecture of their respective encoding subsystems. Specifically, encoding subsystem 413 is similar to encoding subsystem 113 in that encoding subsystem 413 comprises a plurality of analog-to-digital converters 417-1, 417-2 and 417-3 as well as a plurality of linear filters 419-1 and 419-2 which serve to process input signal s(t) through more than two distinct paths.

Encoding subsystem 413 differs from encoding subsystem 213 in that encoding subsystem 413 additionally includes an interleave 421 for interleaving the multiple data stream outputs from ADCs 417 prior to decoding. In this capacity, it is to be understood that interleave-based distortion products generated by interleave 421 can be used as an additional form of signal diversity during signal reconstruction by decoding subsystem 415.

It should be noted that the present invention is not limited to the use of filters to impart variation to the multiple data processing streams. As defined herein, use of the term "variation" denotes any relative encoding between channels (e.g., differences in phase, amplitude and nonlinearities between data streams). As part of the present invention, it is to be understood that alternative means for introducing encoded variation into an input signal could be utilized without departing from the spirit of the present invention.

Figure 3E:
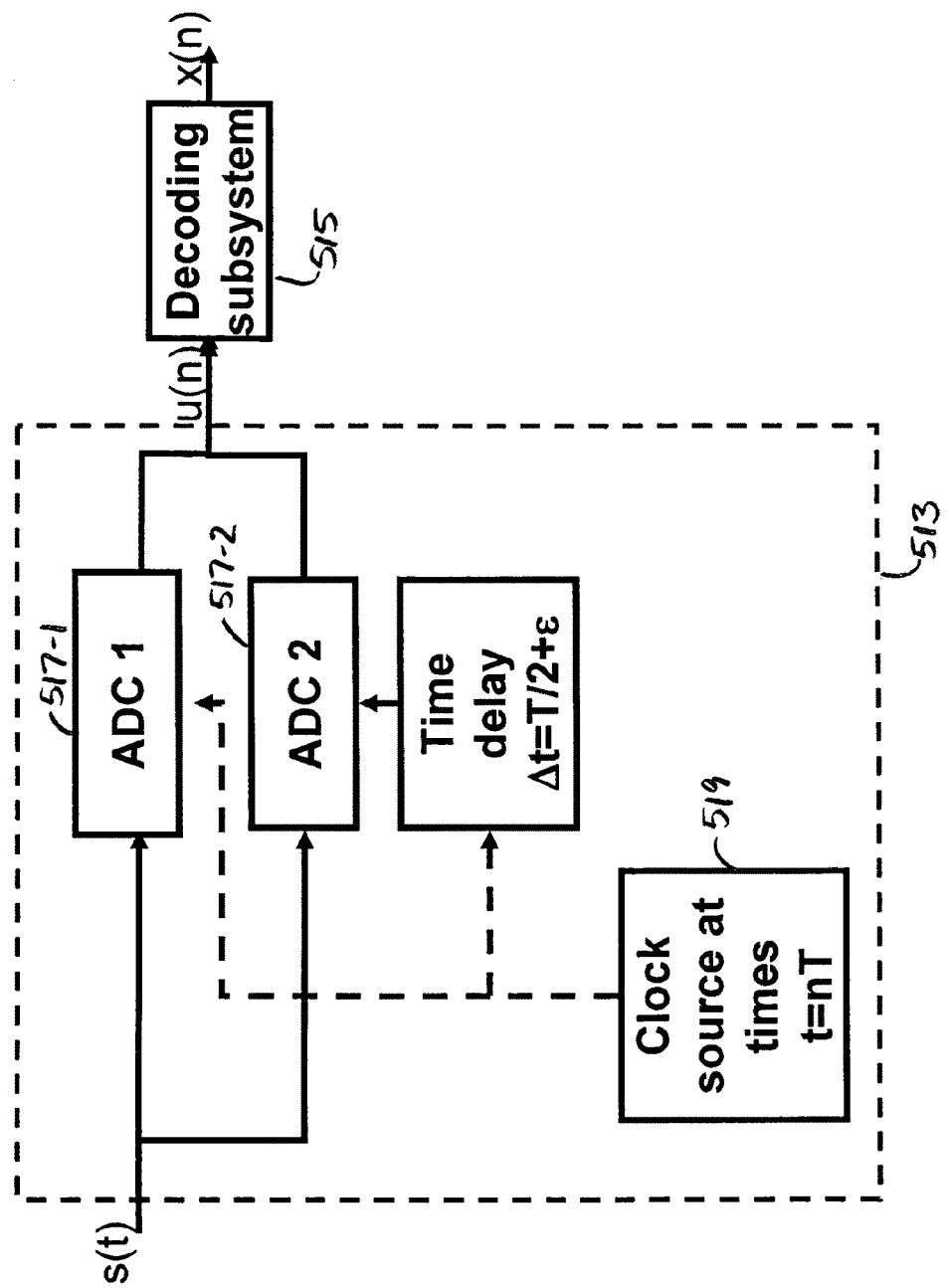

As an example, in FIG. 3(e), there is shown a simplified schematic representation of another modified signal sensing, sampling and processing system, the system being identified generally by reference numeral 511. As can be seen, system 511 comprises a modified multi-channel encoding subsystem 513 for encoding an input signal s(t) into multiple paths to yield an N-channel encoded signal u(n) and a decoding subsystem 515 for decoding signal u(n) by exploiting mismatch effects present therein to yield an decoded output signal x(n).

System 511 differs from system 111 in the architecture of their respective encoding subsystems. Specifically, encoding subsystem 513 is similar to encoding subsystem 113 in that encoding subsystem 513 comprises first and second analog-to-digital converters 517-1 and 517-2 that process input signal s(t) along two distinct paths.

Encoding subsystem 513 differs from encoding subsystem 113 in that encoding subsystem 513 utilizes a clock 519, rather than a filter, to induce a frequency-based phase shift between ADCs 517. For example, as represented herein, ADC 517-1 samples input signal s(t) at time t=nT, where T is the established sample period. However, due to the time delay imparted by clock 519, ADC 517-2 samples input signal s(t) using the same time period T but offset by E, where E<T, thereby resulting in an offset sampling rate of t=nT+E. As can be appreciated, applying a time delay on the second signal path has the effect of imparting a phase shift in the frequency domain. Consequently, the frequency-dependent phase difference created between the signal paths introduces useful channel mismatch effects which can be exploited by decoding subsystem 515 during reconstruction, which is highly desirable.

It is to be understood that the frequency-based phase shift induced by clock 519 could be similarly applied to an encoding subsystem with three or more ADCs without departing from the spirit of the present invention. Furthermore, it is to be understood that an interleaver could be used to interleave the multiple data stream outputs of ADCs 517 prior to decoding in order to produce an interleaving distortion product that can also be exploited by decoding subsystem 515 during signal reconstruction.

Figure 3F:
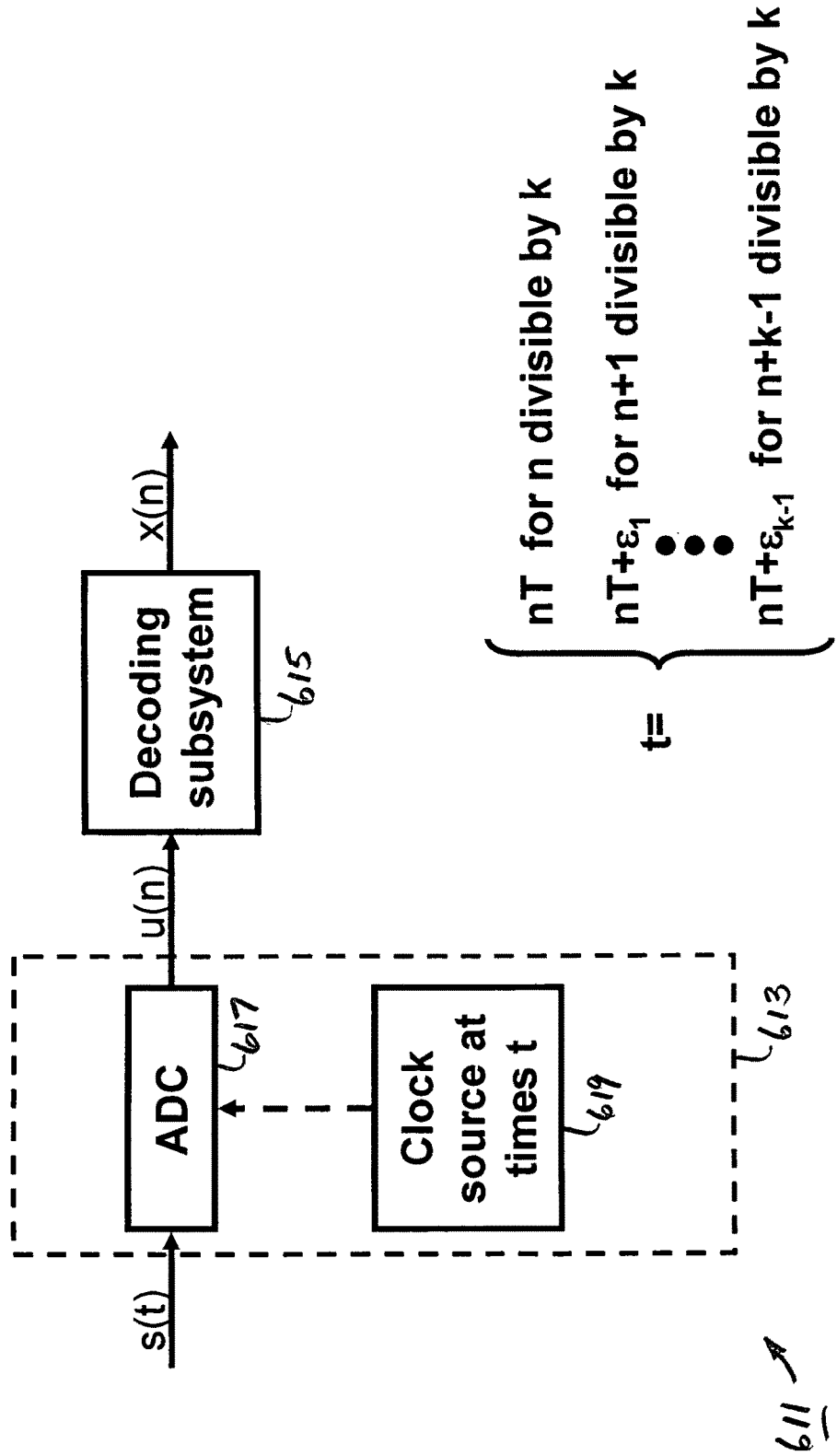

As another example, in FIG. 3(f), there is shown a simplified schematic representation of another modified signal processing system, the modified signal processing system being identified generally by reference numeral 611. As can be seen, system 611 comprises a modified multi-channel encoding subsystem 613 for encoding an input signal s(t) into multiple paths to yield an N-channel encoded signal u(n) and a decoding subsystem 615 for decoding signal u(n) by exploiting channel mismatch effects present therein to yield an decoded output signal x(n).

System 611 differs from system 511 in the architecture of their respective encoding subsystems. Specifically, encoding subsystem 613 relies solely upon the use of a single analog-to-digital converter 617 and a clock 619 to produce multiple data streams from input signal s(t). In use, the plurality of data streams are acquired from a single ADC 617 by using the following sampling formula: $\Delta t_{sample}(n) > T_{min}$, where $\Delta t_{sample}(n)$ is the time delay between successive samples, and $T_{min}$ is the minimum sample period that is attainable by ADC 617. It is to be understood that clock 619 does not operate at a uniform rate. Accordingly, clock 619 must be designed to trigger a signal conversion at the desired time offsets. After conversion, the output data stream generated by ADC 617 may need to be subjected to a de-multiplexing process to produce the multiple data streams, this de-multiplexing requirement being dependent upon the decoding technique employed by decoding subsystem 615.

It to be understood that the frequency-based phase shift induced by clock 519 could be similarly applied to an encoding subsystem with three or more ADCs without departing from the spirit of the present invention. Furthermore, it is to be understood that an interleaver could be used to interleave the multiple data stream outputs of ADCs 517 prior to decoding in order to produce an interleave distortion product that can be exploited by decoding subsystem 515 during signal reconstruction.

Although a significant number of signal processing system implementations are provided herein, it is envisioned that each of the above-described signal processing systems could be further modified without departing from the spirit of the present invention.

Novel Method of Signal Sensing, Sampling and Processing

As referenced above, system 11 is designed to perform a novel method of signal sensing, sampling and processing which relies upon the exploitation of information associated with channel mismatch effects that are present in an encoded signal u(n). Using the mismatch effects, a decoder is able to accurately reconstruct an encoded signal u(n) within its proper frequency zone.

Figure 4:
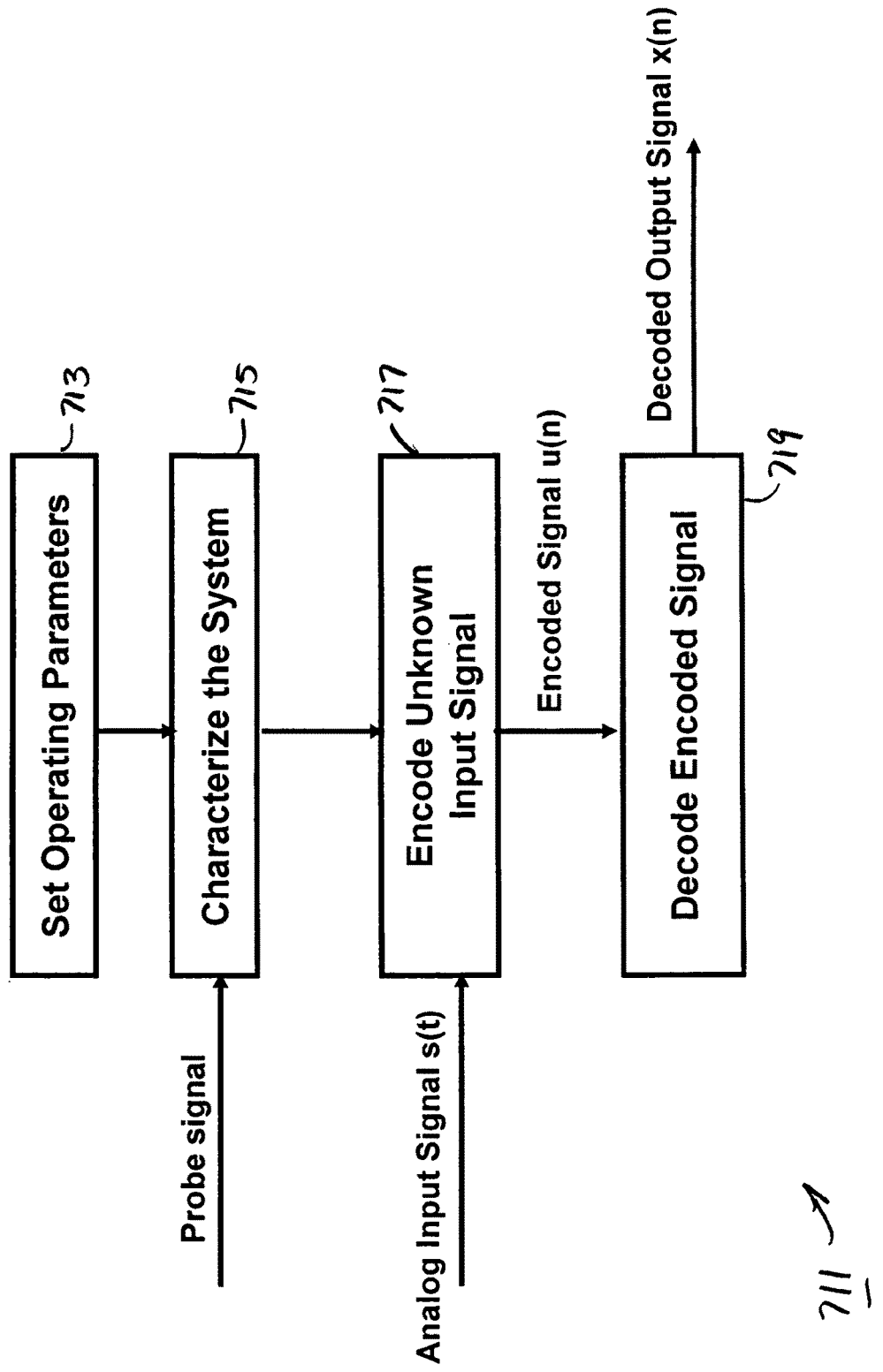
FIG. 4 is a simplified flow chart of a novel method of signal sensing, sampling and processing using the system shown in FIG. 1.

Referring now to FIG. 4, there is shown a simplified flow chart of the signal sensing, sampling and processing method of the present invention, the method being identified generally by reference numeral 711. As can be seen, method 711 commences by setting the operating parameters for system 11 to maximize its performance capabilities, the operating parameters setting step being identified generally by reference numeral 713.

As defined herein, "setting the operating parameters" refers generally to, among other things, (i) outlining bandwidths of interest (i.e., targeting a bandwidth range for input signal s(t)), (ii) establishing an optimal sampling rate, and (iii) defining encoding subsystem 13 to cover the Nyquist zones of the input signal bandwidth. By setting the operating parameters in the manner set forth in detail above, decoding subsystem 15 is better able to distinguish signals of interest between sub-Nyquist zones, which is highly desirable.

It should be noted that the system operating parameters set forth in detail above are selected in view of, inter alia, the architecture of encoding subsystem 13 as well as any a priori knowledge of the input signal (e.g., input signal has sparse spectral content over a large frequency range). Accordingly, it is to be understood that the operating parameters established in setting step 713 may be unique for each intended application.

Upon completion of setting step 713, system 11 is prepared using known test signals in order to characterize encoding subsystem 13, the encoding characterization step being identified generally by reference numeral 715. As defined herein, "characterizing the system" refers generally to probing system 11 with a known test input signal in order to collect information on encoding subsystem 13 that differentiates subsystem 13 between input signal frequency zones, which are also referred to herein simply as "Nyquist zones".

For example, as part of characterization step 715, multiple ADC system 111 is probed with known test signals that fall within the target bandwidth range of input signal s(t). In response thereto, the complex amplitude that occurs between the output signal from each ADC 117 is measured for each frequency bin. The observed shift in magnitude and/or phase between sampled channels is identified for each Nyquist zone and is, in turn, utilized by decoding subsystem 15 to facilitate accurate signal reconstruction, as will be described further in detail below.

It should be noted that together steps 713 and 715 represent set-up, or preparatory, processes that are included to optimize the operation of system 11. With initial configuration steps 713 and 715 completed, system 11 is prepared to process an input signal of interest. Specifically, in encoding step 717, an unknown input signal s(t), such as an un-encoded wideband analog signal, is passed through encoding subsystem 13. In response thereto, subsystem 13 encodes the input signal s(t) into multiple data streams that are, in turn, recorded by decoding subsystem 15.

As the final step of signal processing process 711, encoded digital signal u(n) is decoded by decoding subsystem 15, the decoding step being identified generally by reference numeral 719. As will be described in detail below, decoding step 719 involves, among other things, digital reconstruction of the encoded digital signal u(n) back to its proper bandwidth using measured channel mismatch effects.

Figure 5:
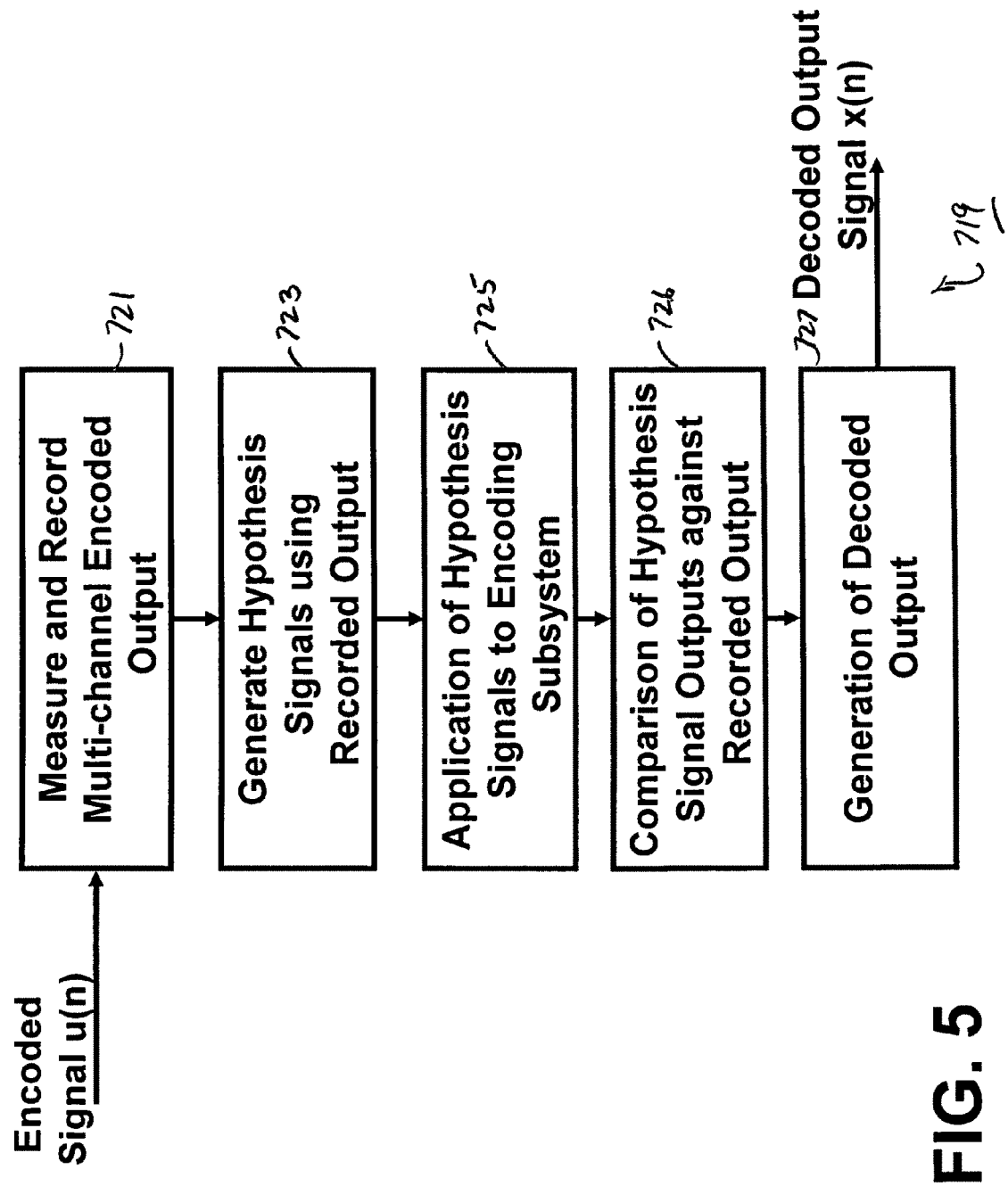
FIG. 5 is a simplified flow chart of the decoding step shown in the method of FIG. 4.

Specifically, referring now to FIG. 5, there is shown a simplified flow chart which is useful in understanding the decoding step 719 of process 711. As can be seen, decoding step 719 commences by measuring and recording the multi-channel encoded signal u(n) generated by encoding subsystem 13, the measuring and recording step being identified generally by reference numeral 721. Decoding subsystem 15 then engages in hypothesis testing to ascertain the bandwidth information needed to reconstruct encoded signal u(n).

In the present example, hypothesis testing is achieved by first selecting a subset or subspace of interest from the encoded data streams (e.g., the strongest signals from the data streams are commonly isolated since these signals often represent the target component). A plurality of hypothesis signals are then generated using system and input signal knowledge (e.g., by mapping isolated signals of interest back to original input signal bandwidth), the generating step being identified generally by reference numeral 723.

Finally, the channel mismatch effect of each hypothesis signal is then mapped in relation (or otherwise compared) to the channel mismatch discrepancy measured for encoded signal u(n) in order to determine the most logical frequency zone location for the original measured encoded signal u(n) during reconstruction, the comparison step being identified generally by reference numeral 726. In particular, by comparing the signal characteristics of mismatch errors (e.g., frequency-dependent phase shifts between signal channels) present in the original measured encoded signal u(n) against the potential signal characteristics of mismatch errors for each hypothesis signal, statistical probability standards can be utilized to determine the hypothesis signal that has the highest probability of representing the original measured encoded signal u(n).

Using the bandwidth information derived from hypothesis testing, decoding subsystem 15 generates a decoded output signal x(n) that reconstructs measured encoded signal u(n) in its appropriate frequency zone, the generating step being identified generally by reference numeral 727.

Undersampling Application Example

It is to be understood that method 711, as described in detail above, has numerous applications. As one practical application, method 711 can be utilized by signal sensing, sampling and processing systems to resolve signal ambiguities created from sub-Nyquist sampling devices by exploiting the information provided from channel mismatch effects produced therefrom.

Figure 6A:
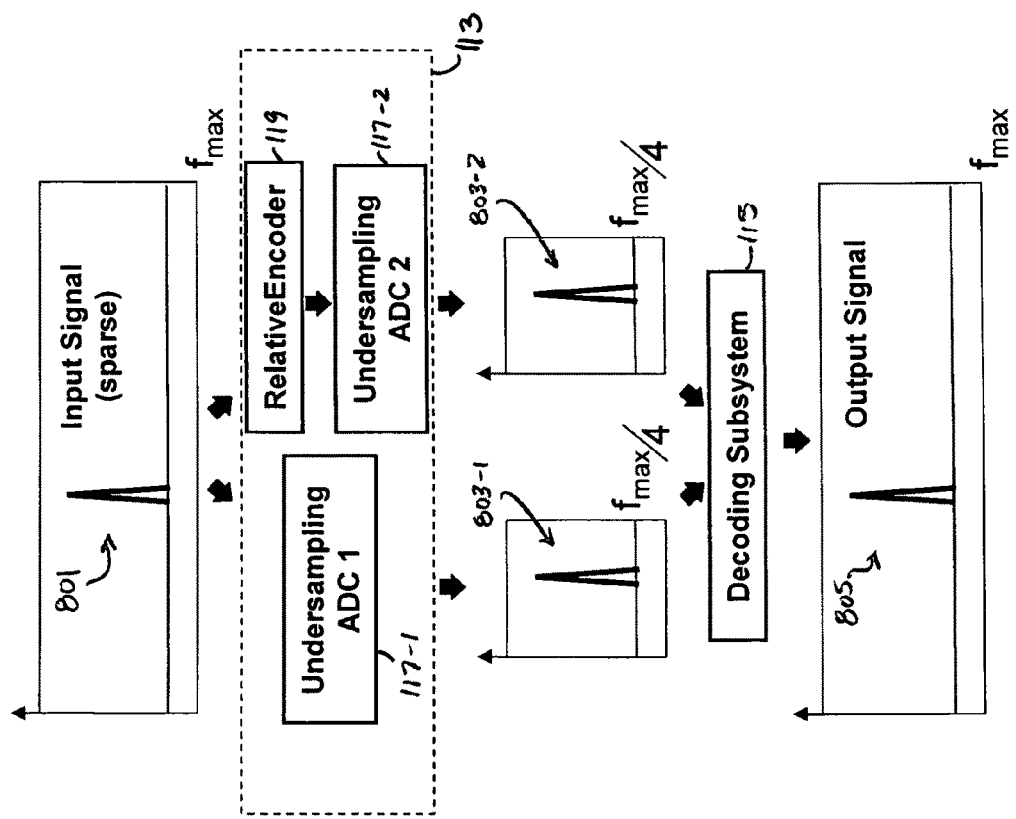
FIG. 6(a) is a series of simplified graphical representations of a sample input signal at various stages of the method shown in FIG. 4, the graphical representations being useful in understanding how the system of FIG. 1 exploits information provided from channel mismatch effects to remedy sub-Nyquist signal sampling defects.
Figure 6B:
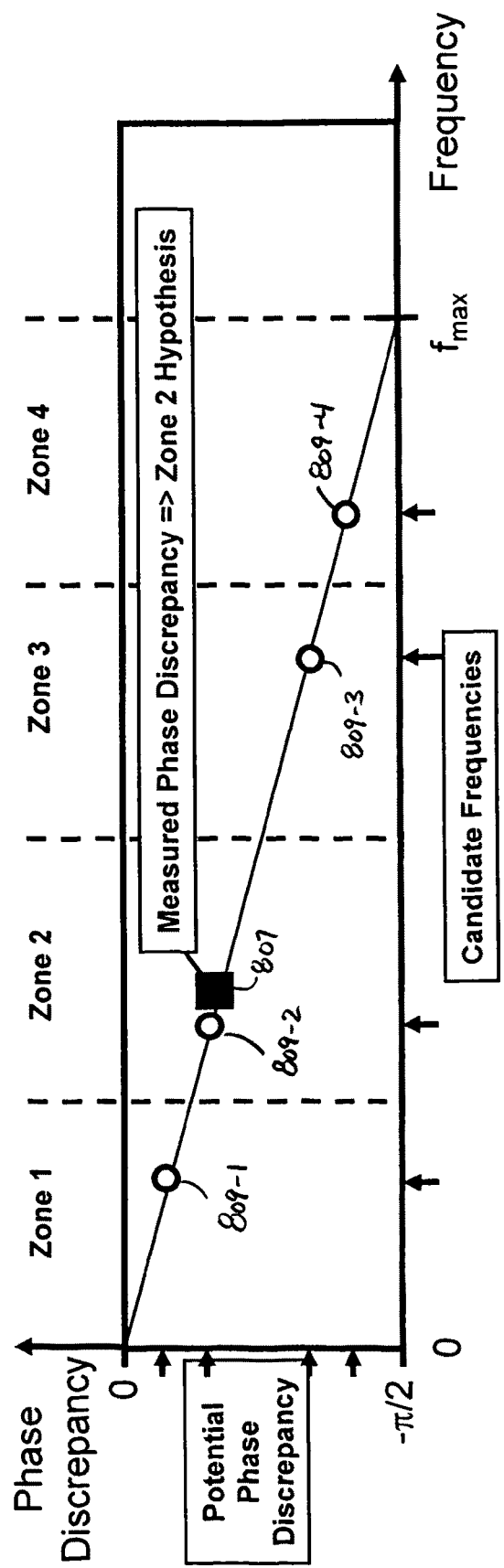
FIG. 6(b) is a simplified graphical representation which is useful in understanding how the relative encoding between the data stream channels shown in FIG. 6(a) can be used in hypothesis testing to determine bandwidth information for the input signal.

Specifically, referring now to FIG. 6(*a*), there is shown a series of simplified graphical representations of a sample input signal at various stages during transmission through system 111, the graphical representations being useful in understanding how system 111 exploits information provided from channel mismatch effects to remedy sub-Nyquist signal sampling ambiguities.

Specifically, a sample analog input signal 801 is shown being introduced into encoding subsystem 113 of system 111, input signal 801 being represented as a sparse wideband signal for purposes of simplicity. As can be seen, input signal 801 in turn passes through each of the pair of channel paths in encoded subsystem 113. Specifically, input signal 801 passes through (i) undersampling ADC 117-1 that is located in a first channel and (ii) relative encoder 119 and undersampling ADC 117-2 that are located in a second channel.

As a result, a multi-channel encoded output signal is generated that includes two channels of data, signal representations of the first and second channels being shown separately and identified generally by reference numerals 803-1 and 803-2, respectively. Because each ADC 117 is set to undersample by a factor of 4, each channel signal 803 is represented as one-quarter the bandwidth of original input signal 801.

In the present example, the variation between the first and second channels is in phase. As a result, the pair of channel signals 803-1 and 803-2 appear the same in amplitude. However, it should be noted that there is a measurable phase discrepancy between encoded channel signals 803-1 and 803-2 as a result of the variation. This phase discrepancy between the pair of data channels can be used to resolve ambiguities created from undersampling, as will be described further below.

The multi-channel encoded signal is then shown passing into decoding subsystem 115 which, in turn, utilizes the measured phase discrepancy between the pair of channel data streams to reconstruct the multi-channel encoded signal as a decoded output signal 805 that is represented in the original input signal bandwidth. As seen most clearly FIG. 6(*b*), the measured phase discrepancy between channel signals 803-1 and 803-2 is mapped, the measured phase discrepancy being identified generally by reference numeral 807. At the same time, because input signal 801 was undersampled by ADCs 117 by a factor of 4, expansion of the encoded signal 803 back to original bandwidth creates four hypothesis signals, each of which is located within corresponding Nyquist zones 1, 2, 3 and 4.

The potential phase discrepancy of each candidate frequency is then mapped against measured phase discrepancy 807, the phase discrepancy candidates being identified generally by reference numerals 809-1, 809-2, 809-3 and 809-4. By comparing each candidate 809 against measured phase discrepancy 807, a highest probability, or "best", candidate can be ascertained (in this case, candidate 809-2). Because the frequency zone of the highest probability candidate is known, this information is used by decoding subsystem 115 to reconstruct the measured encoded signal within its proper frequency zone in the full band spectrum, which is highly desirable.

Inherent Benefits Associated with the Method of the Present Invention

It is to be understood that the signal sensing, sampling and processing method described in detail above inherently provides a number of notable advantages over traditional sub-Nyquist sampling processes, such as compressed sampling techniques.

For example, the signal sensing, sampling and processing method of the present invention requires relatively low complexity encoding and decoding processes in comparison to traditional techniques. Specifically, the analog hardware required for relative encoding is rather simple in construction, such a time delay, and the digital processing decoder requires a lower number of computational operations in comparison to traditional methods.

As another example, the signal sensing, sampling and processing method of the present invention has a lower signal sparseness requirement than traditional techniques and, as such, has a broader range of potential applications.

As another example, the signal sensing, sampling and processing method of the present invention is less sensitive to background noise due to the fact that the input signal is not expanded during the encoding process.

Signal Sensing, Sampling and Processing Using Adaptive Modification

It should be noted that the method of signal sensing, sampling and processing set forth in detail above could be modified as deemed necessary without departing from the spirit of the present invention. For example, it is to be understood that the method of the present invention could be altered in certain applications to permit adaptive modification.

Figure 7:
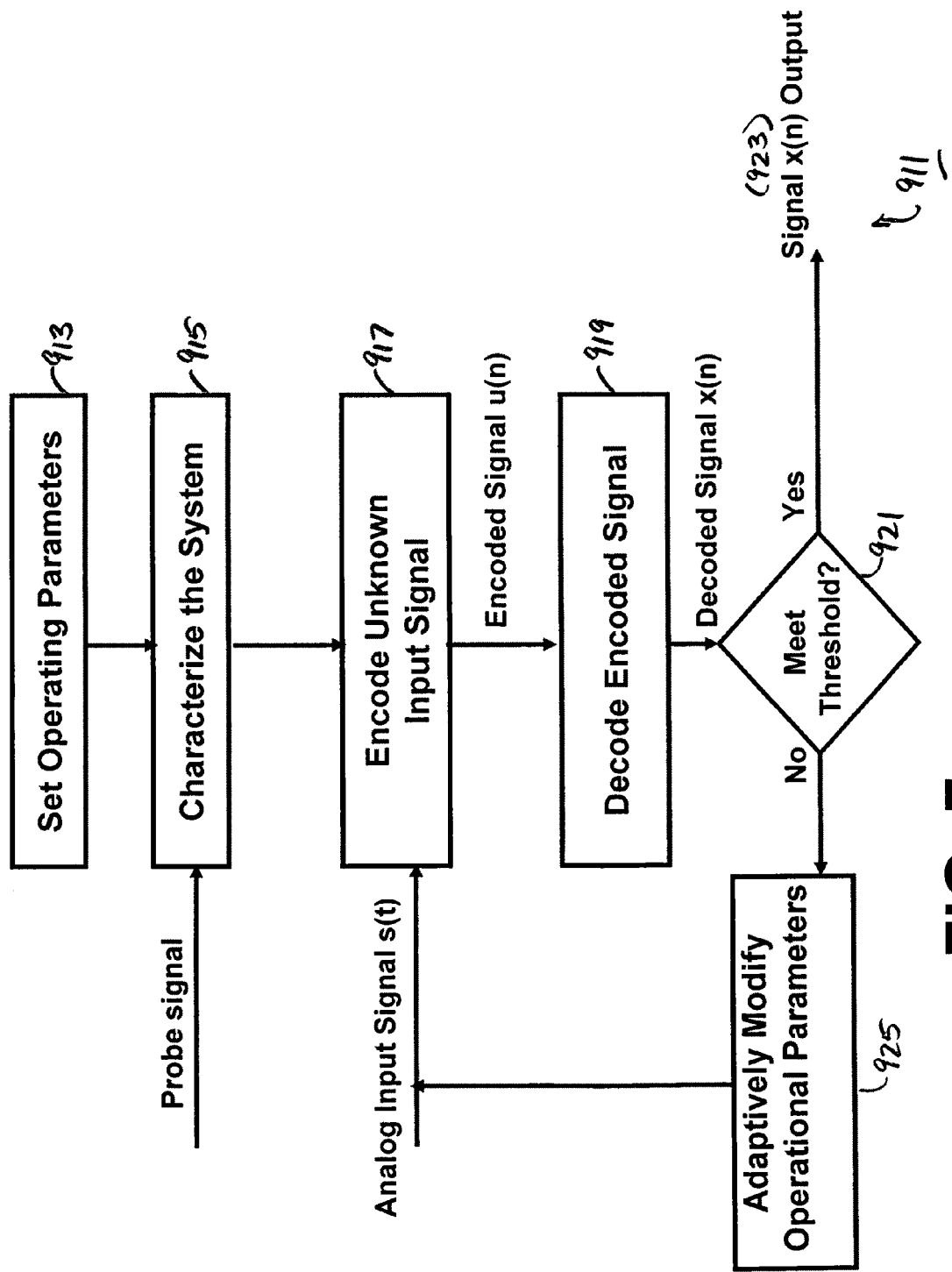
FIG. 7 is a simplified flow chart of a novel adaptive method of signal sensing, sampling and processing using the system shown in FIG. 1.

As defined herein, "adaptive modification" denotes utilizing measured decoded information relating to the target signal to adaptively modify operating parameters for system 11 after completion of the initial set-up. Specifically, referring now to FIG. 7, there is shown a simplified flow chart of a novel adaptive method of signal sensing, sampling and processing, the method being identified generally by reference numeral 911.

Method 911 is similar to method 711 in that method 911 commences by setting the operating parameters for system 11 to maximize its performance capabilities, the operating parameters setting step being identified generally by reference numeral 913. Upon completion of step 913, system 11 is prepared using known test signals in order to characterize encoding subsystem 13, the encoding characterization step being identified generally by reference numeral 915. Once initial configuration steps 913 and 915 are completed, system 11 is prepared to process an input signal of interest. Accordingly, in an encoding step 917, an input signal is passed through encoding subsystem 13 which, in turn, encodes the input signal into multiple data streams that are, in turn, recorded by decoding subsystem 15. In response, the encoded digital signal is decoded by decoding subsystem 15, the decoding step being identified generally by reference numeral 919.

As can be appreciated, method 911 differs from method 711 in that upon completion of decoding step 919, the reconstructed signal is subjected to a system algorithm to determine the probability of proper signal reconstruction, as represented generally by reference numeral 921. If the decoded signal meets a pre-defined accuracy threshold, the decoded signal is output at its original bandwidth, as represented generally by reference numeral 923. However, if the accuracy threshold is not met, the operating parameters for system 11 are adaptively modified (i.e., modified "on the fly") in adaptive modification step 925. As a result, an input signal can then be re-introduced into system 11 with the modified parameters in order to resolve any accuracy issues in connection with signal decoding.

It has been found that adaptive modification is typically required in certain circumstances including, but not limited to, (i) encoded signals that fall close to Nyquist zone boundaries, and (ii) encoded signals that experience signal blending, or overlap. As can be appreciated, both of the aforementioned conditions are often easily resolved by modifying system operating parameters. For example, when target signals fall close to Nyquist zone boundaries, the boundaries can be effectively shifted by, inter alia, modifying the system sampling rate.

Signal Sensing, Sampling and Processing without Pre-Characterization

Figure 8:
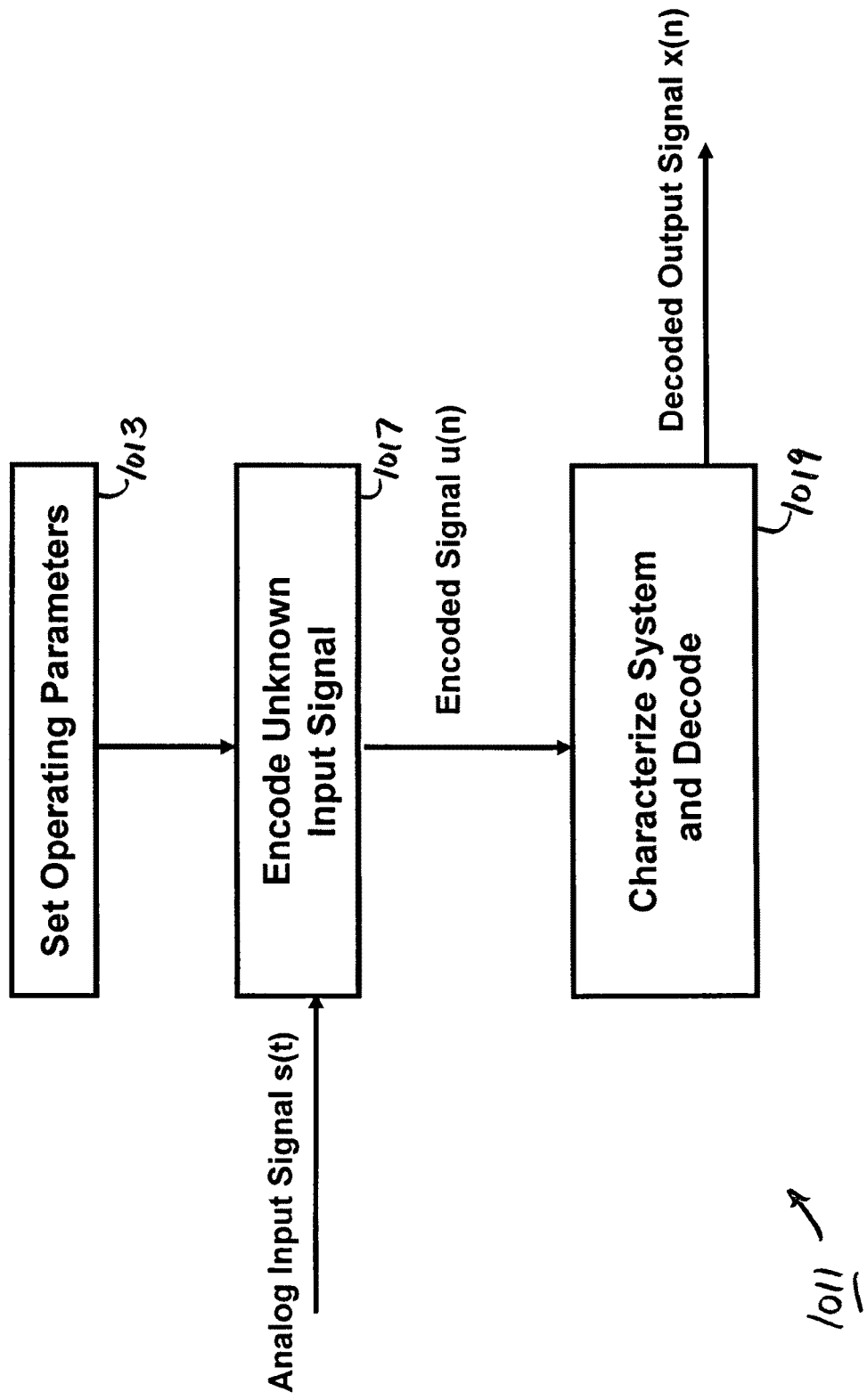
FIG. 8 is a simplified flow chart of a novel method of signal sensing, sampling and processing using the system shown in FIG. 1, the method being designed to encode an input signal without pre-characterization of the system.

It is also to be understood that certain steps in signal processing method 711 could be either removed and/or combined without departing from the spirit of the present invention. For example, referring now to FIG. 8, there is shown simplified flow chart of a novel adaptive method of signal sensing, sampling and processing, the method being identified generally by reference numeral 911.

Method 1011 is similar to method 711 in that method 1011 commences by setting the operating parameters for system 11 to maximize its performance capabilities, the operating parameters setting step being identified generally by reference numeral 1013. Upon completion of step 1013, system 11 is prepared to process an input signal of interest without pre-characterization of system 11. Accordingly, in an encoding step 1017, an unknown input signal (e.g., a wideband analog signal) is passed through encoding subsystem 13 which, in turn, encodes the input signal into multiple data streams that are, in turn, recorded by decoding subsystem 15. During or upon completion of the encoding process, system 11 is characterized. After system 11 is characterized, the encoded signal is then decoded by decoding subsystem 15.

In the present example, the system characterization and decoding steps occur after the encoding process and, as such, are identified generally by common reference numeral 1019. However, it is to be understood that method 1011 could be modified to denote that system characterization occurs during the encoding process, rather than the decoding process, without departing from the spirit of the present invention.

Furthermore, it is to be understood that, when no known probe signal is available for injection into system, the system characterization process can be achieved blindly without departing from the spirit of the present invention. As can be appreciated, blind system characterization is typically required when information relating to the input signal is unavailable (e.g., in military applications).

The embodiments shown of the present invention are intended to be merely exemplary and those skilled in the art shall be able to make numerous variations and modifications to them without departing from the spirit of the present invention. All such variations and modifications are intended to be within the scope of the present invention as defined in the appended claims.

For example, it is to be understood that the undersampling application described in detail above could be modified to exploit information provided in the form of jitter error (i.e., the stochastic differences in sampler response) to decode an encoded signal. Specifically, as defined herein, "jitter error" relates to the random error associated with sampling times of high rate sampling devices. Accordingly, it is to be understood that artifacts of the jitter signature can be used to accurately decode undersampled signals and thereby overcome inherent spectral ambiguities.

What is claimed is:

1. A system for sensing, sampling and processing an input signal of a first bandwidth, the system comprising:
   (a) an encoding subsystem for sensing and sampling the input signal using a sub-Nyquist sampling rate into a plurality of distinct data paths so as to yield a multi-channel encoded signal of a second bandwidth, the encoding imparting at least one known variation between channels of the encoded signal, and
   (b) a decoding subsystem for processing the encoded signal back to the first bandwidth to yield a decoded output signal, the decoding subsystem resolving undersampling issues by generating a hypothesis signal for each Nyquist zone, comparing the variation between channels of each hypothesis signal against the known variation between channels of the encoded signal to ascertain a highest probability hypothesis signal and utilizing frequency zone location information associated with the highest probability hypothesis signal to reconstruct the encoded signal within its proper frequency zone.

2. The system as claimed in claim 1 wherein the encoding subsystem comprises:
   (a) a first analog-to-digital converter located in a first data path,
   (b) a second analog-to-digital converter located in a second data path, and
   (c) means for imparting relative variation between the first and second data paths.

3. The system as claimed in claim 2 wherein the relative variation means is provided by a filter located in one of the first and second data paths.

4. The system as claimed in claim 2 wherein the relative variation means is provided by a clock that induces a phase discrepancy between each of the first and second analog-to-digital converters.

5. The system as claimed in claim 2 wherein the encoding subsystem additionally comprises:
   (a) a third analog-to-digital converter located in a third data path, and
   (b) means for imparting relative variation between the third data path and each of the first and second data paths.

6. The system as claimed in claim 2 wherein the encoding subsystem additionally comprises an interleave for interleaving the plurality of data path outputs from the first and second analog-to-digital converters.

7. The system as claimed in claim 1 wherein the encoding subsystem comprises:
   (a) at most one analog-to-digital converter adapted to receive the input signal, and
   (b) a clock coupled to the at most one analog-to-digital converter, the clock causing the at most one analog-to-digital converter to produce a plurality of data streams from the input signal with relative variation.

8. A method of sensing, sampling and processing an input signal using a signal sensing, sampling and processing system, the signal sensing, sampling and processing system comprising an encoding subsystem and a decoding subsystem, the method comprising the steps of:
- (a) setting the operating parameters for the encoding subsystem,
- (b) encoding the input signal into a plurality of distinct data paths using the encoding subsystem with a sub-Nyquist sampling rate so as to yield a multi-channel encoded signal of a second bandwidth, the encoding subsystem imparting at least one known variation between channels of the encoded signal, and
- (c) decoding the encoded signal using the decoding subsystem to yield a decoded output signal of the first bandwidth, the decoding step resolving undersampling issues during reconstruction of the encoded signal back to the first bandwidth by exploiting the information provided by the at least one known variation, the decoding step comprising the sub-steps of:
    - (i) measuring and recording the multi-channel encoded signal generated by the encoding subsystem,
    - (ii) generating a series of hypothesis signals using the recorded encoded signal, one hypothesis signal being generated for each Nyquist zone,
    - (iii) comparing the variation between channels of each hypothesis signal against the measured variation between channels of the encoded signal to ascertain a highest probability hypothesis signal, and
    - (iv) utilizing frequency zone location information associated with the highest probability hypothesis signal to reconstruct the encoded signal within its proper frequency zone.

9. The method as claimed in claim 8 wherein the operating parameters setting step includes sub-steps from the group consisting of outlining bandwidths of interest, establishing an optimal sampling rate, and defining the encoding subsystem to cover the Nyquist zones of the input signal.

10. The method as claimed in claim 8 further comprising the step of, after the operating parameters setting step but before the encoding step, characterizing the signal sensing, sampling and processing system using known test signals.

11. The method as claimed in claim 8 further comprising the step of, during the encoding step, characterizing the signal sensing, sampling and processing system using unknown input signals.

12. The method as claimed in claim 8 further comprising the step of, after the encoding step but before the decoding step, characterizing the signal sensing, sampling and processing system using unknown input signals.

13. The method as claimed in claim 8 further comprising the step of, after the decoding step, adaptively modifying the operating parameters for the signal sensing, sampling and processing system using information from the decoded output signal.

14. A method of sensing, sampling and processing an input signal using a signal sensing, sampling and processing system, the signal sensing, sampling and processing system comprising an encoding subsystem and a decoding subsystem, the method comprising the steps of:
- (a) setting the operating parameters for the encoding subsystem, the operating parameters setting step including sub-steps from the group consisting of outlining bandwidths of interest, establishing an optimal sampling rate, and defining the encoding subsystem to cover the Nyquist zones of the input signal,
- (b) encoding the input signal into a plurality of distinct data paths using the encoding subsystem so as to yield a multi-channel encoded signal of a second bandwidth that includes at least one channel mismatch effect, and
- (c) decoding the encoded signal using the decoding subsystem to yield a decoded output signal of the first bandwidth, the decoding step exploiting the information provided by the at least one channel mismatch effect to accurately reconstruct the encoded signal back in the first bandwidth, the decoding step comprising the sub-steps of:
    - (i) measuring and recording the multi-channel encoded signal generated by the encoding subsystem,
    - (ii) engaging in hypothesis testing to ascertain bandwidth information associated with the input signal, the hypothesis testing step comprising the sub-steps of:
        - (A) generating a series of hypothesis signals using the recorded encoded signal,
        - (B) comparing the potential channel mismatch effects of each hypothesis signal against the measured channel mismatch effects for the recorded encoded signal to ascertain a highest probability hypothesis signal, and
        - (C) utilizing bandwidth information associated with the highest probability hypothesis signal to determine bandwidth information associated with the input signal, and
    - (iii) generating a decoded output signal in the first bandwidth using the bandwidth information derived from hypothesis testing.

* * * * *